(12) United States Patent
Ye et al.

(10) Patent No.: US 9,978,160 B2
(45) Date of Patent: May 22, 2018

(54) METHOD AND APPARATUS FOR RECONSTRUCTING IMAGE USING LOW RANK FOURIER INTERPOLATION SCHEME

(71) Applicant: Korea Advanced Institute of Science and Technology, Daejeon (KR)

(72) Inventors: Jong Chul Ye, Daejeon (KR); Kyong Hwan Jin, Daejeon (KR)

(73) Assignee: KOREA ADVANCED INSTITUTE OF SCIENCE AND TECHNOLOGY, Daejeon (KR)

( * ) Notice: Subject to any disclaimer, the term of this patent is extended or adjusted under 35 U.S.C. 154(b) by 256 days.

(21) Appl. No.: 14/935,175

(22) Filed: Nov. 6, 2015

(65) Prior Publication Data

US 2016/0267689 A1    Sep. 15, 2016

(30) Foreign Application Priority Data

Mar. 11, 2015  (KR) .................. 10-2015-0034081

(51) Int. Cl.
*G06K 9/00* (2006.01)
*G06T 11/00* (2006.01)

(52) U.S. Cl.
CPC .. *G06T 11/008* (2013.01); *G06T 2207/10081* (2013.01); *G06T 2207/10088* (2013.01); *G06T 2207/20021* (2013.01); *G06T 2207/20024* (2013.01); *G06T 2207/20048* (2013.01)

(58) Field of Classification Search
CPC . G06T 2207/10081; G06T 2207/10088; G06T 2207/20021; G06T 2207/20024; G06T 2207/20048; G06T 11/008; G01R 33/5611
See application file for complete search history.

(56) References Cited

U.S. PATENT DOCUMENTS

| 2012/0081114 | A1* | 4/2012 | Weller | G01R 33/5611 324/309 |
| 2015/0192654 | A1* | 7/2015 | Zhu | G01R 33/5611 324/309 |
| 2016/0370444 | A1* | 12/2016 | Peng | G01R 33/5608 |

* cited by examiner

Primary Examiner — Amara Abdi
(74) Attorney, Agent, or Firm — EIP US LLP

(57) ABSTRACT

A method and apparatus for reconstructing an image using a low rank Fourier interpolation scheme are provided. The method may reconstruct information of a k-space domain based on the information of the k-space domain using an imaging apparatus, for example, a magnetic resonance imaging (MRI) apparatus, a computed tomography (CT) apparatus, and a diffraction tomography apparatus. The method may generate a block Hankel matrix based on the information of the k-space domain, and may complete the block Hankel matrix using a low rank matrix completion algorithm, to reconstruct corresponding information of the k-space domain.

12 Claims, 7 Drawing Sheets

METHOD AND APPARATUS FOR RECONSTRUCTING IMAGE USING LOW RANK FOURIER INTERPOLATION SCHEME

CROSS-REFERENCE TO RELATED APPLICATIONS

This application claims priority under 35 U.S.C. § 119(a) to Korean Patent Application No. 10-2015-0034081, filed on Mar. 11, 2015, in the Korean Intellectual Property Office, the disclosure of which is incorporated herein by reference.

BACKGROUND OF THE INVENTION

The following description relates to an image reconstruction technology, and more particularly, to an apparatus and method for reconstructing an image using an image reconstruction algorithm.

In a finite rate of innovation (FRI) sampling theory, a filter configured to change values of sparse signals (for example, signals having a Dirac delta stream or a Dirac delta stream for a differential operator) to a value of "0" at all times by convolution with signals in a Fourier domain may exist, and may be referred to as an "annihilating filter." When this is represented by a matrix equation, a matrix of a Hankel structure including an image signal may have a small number of matrix coefficients.

Accordingly, there is a desire for a technology of reconstructing a lost signal using a minimum rank matrix completion algorithm.

SUMMARY

An aspect of the present invention is to reconstruct lost k-space information in an image domain without an artifact, based on only information in a k-space instead of performing calculation in the image domain in fast Fourier imaging. Another aspect of the present invention is to ensure a high image reconstruction performance in multiple channels through a low rank minimization, in comparison to a single channel.

According to an aspect, there is provided a method of reconstructing an image, the method including acquiring lost k-space data using an imaging apparatus capable of acquiring k-space data, and reconstructing the image by interpolating additional Fourier data based on the lost k-space data using a low rank matrix completion algorithm, wherein the imaging apparatus includes at least one of a magnetic resonance imaging (MRI) apparatus, a computed tomography (CT) apparatus, and a diffraction tomography apparatus.

The reconstructing of the image may include converting the lost k-space data into a block Hankel matrix using a commutative law of a convolution operation in a domain of a k-space, based on presence of an annihilating filter in the k-space, and reconstructing the block Hankel matrix using a plurality of low rank matrix completion algorithms.

The reconstructing of the image may include assigning weights to the lost k-space data based on a feature of a sparsifying transform of an existing image corresponding to the lost k-space data, and generating the existing image, wherein the existing image is a sparsified image. The sparse transform may be, for example, Fourier transform (FT).

The reconstructing of the image may include converting each of pyramid patches into a block Hankel matrix and reconstructing the image using a plurality of minimum rank matrix completion algorithms, the pyramid patches forming a pyramid structure.

A first pyramid patch in the pyramid structure may correspond to an entire k-space.

The reconstructing of the image may include reconstructing the entire k-space using a matrix completion algorithm, generating a second pyramid patch by reducing a size of the first pyramid patch based on a direct current (DC) value in the reconstructed k-space, setting reconstructed values of the first pyramid patch as initial values, and reconstructing a low frequency region of the k-space based on the initial values using the matrix completion algorithm.

The reconstructing of the image may include applying different stopping criteria for each of the pyramid patches.

The applying of the different stopping criteria may include applying a stopping criterion equal to or less than a preset criterion to a pyramid patch including an amount of noise equal to or greater than a preset amount among the pyramid patches, and applying a stopping criterion equal to or greater than the preset criterion to a pyramid patch from which a low frequency region is cut among the pyramid patches.

The reconstructing of the image may include performing k-space weighting on each of pyramid patches in a k-space acquired from multiple coils and/or multiple spectra, and independently performing k-space unweighting on each of the pyramid patches after reconstructing of a block Hankel matrix corresponding to each of the pyramid patches.

The reconstructing of the image may include converting k-space data acquired from multiple coils of the imaging apparatus into a block Hankel matrix, and reconstructing the image based on the block Hankel matrix.

According to another aspect, there is provided an apparatus for reconstructing an image, the apparatus including a processor to acquire lost k-space data using an imaging apparatus capable of acquiring k-space data, and to reconstruct the image by interpolating additional Fourier data based on the lost k-space data using a low rank matrix completion algorithm, wherein the imaging apparatus includes at least one of an MRI apparatus, a CT apparatus, and a diffraction tomography apparatus.

The processor may convert the lost k-space data into a block Hankel matrix using a commutative law of a convolution operation in a domain of a k-space, based on presence of an annihilating filter in the k-space, and may reconstruct the block Hankel matrix using a plurality of low rank matrix completion algorithms.

The processor may assign weights to the lost k-space data based on a feature of a sparsifying transform of an existing image corresponding to the lost k-space data, and may generate the existing image, wherein the existing image is a sparsified image.

The processor may convert each of pyramid patches forming a pyramid structure into a block Hankel matrix and may reconstruct the image using a plurality of minimum rank matrix completion algorithms.

A first pyramid patch in the pyramid structure may correspond to an entire k-space.

The processor may reconstruct the entire k-space using a matrix completion algorithm, may generate a second pyramid patch by reducing a size of the first pyramid patch based on a DC value in the reconstructed k-space, may set reconstructed values of the second pyramid patch as initial values, and may reconstruct a low frequency region of the k-space based on the initial values using the matrix completion algorithm.

The processor may apply different stopping criteria for each of the pyramid patches.

The processor may apply a stopping criterion equal to or less than a preset criterion to a pyramid patch including an amount of noise equal to or greater than a preset amount among the pyramid patches, and may apply a stopping criterion equal to or greater than the preset criterion to a pyramid patch from which a low frequency region is cut among the pyramid patches.

The processor may perform k-space weighting on each of pyramid patches in a k-space acquired from multiple coils and/or multiple spectra, and may independently perform k-space unweighting on each of the pyramid patches after reconstructing of a block Hankel matrix corresponding to each of the pyramid patches.

The processor may convert k-space data acquired from multiple coils of the imaging apparatus into a block Hankel matrix, and may reconstruct the image based on the block Hankel matrix.

BRIEF DESCRIPTION OF THE DRAWINGS

These and/or other aspects, features, and advantages of the invention will become apparent and more readily appreciated from the following description of exemplary embodiments, taken in conjunction with the accompanying drawings of which.

DETAILED DESCRIPTION OF CERTAIN INVENTIVE EMBODIMENTS

Figure 1A:
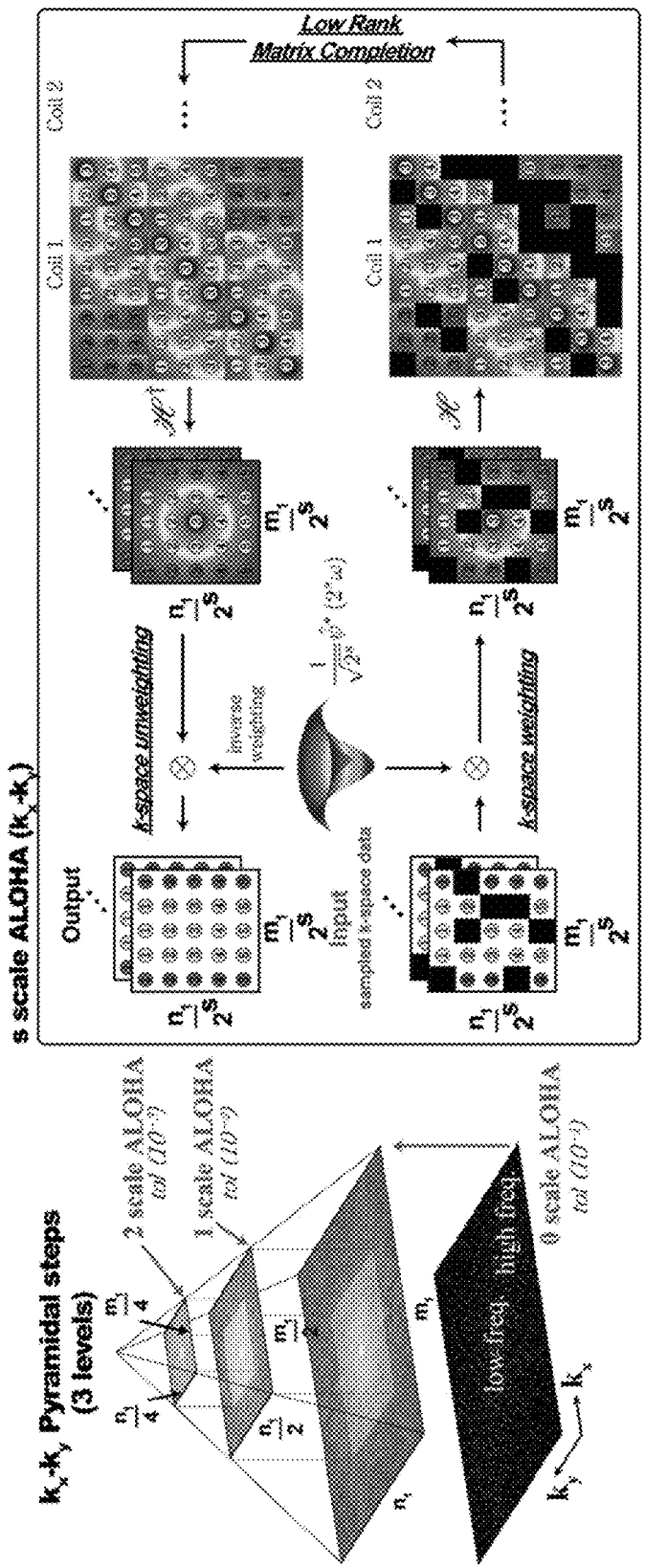
FIGS. 1A and 1B are diagrams provided to explain a process of performing a low rank reconstruction scheme using a pyramid structuralization in an image reconstruction apparatus according to an embodiment.

Reference will now be made in detail to exemplary embodiments of the present invention, examples of which are illustrated in the accompanying drawings, wherein like reference numerals refer to the like elements throughout. Exemplary embodiments are described below to explain the present invention by referring to the figures.

Figure 1B:
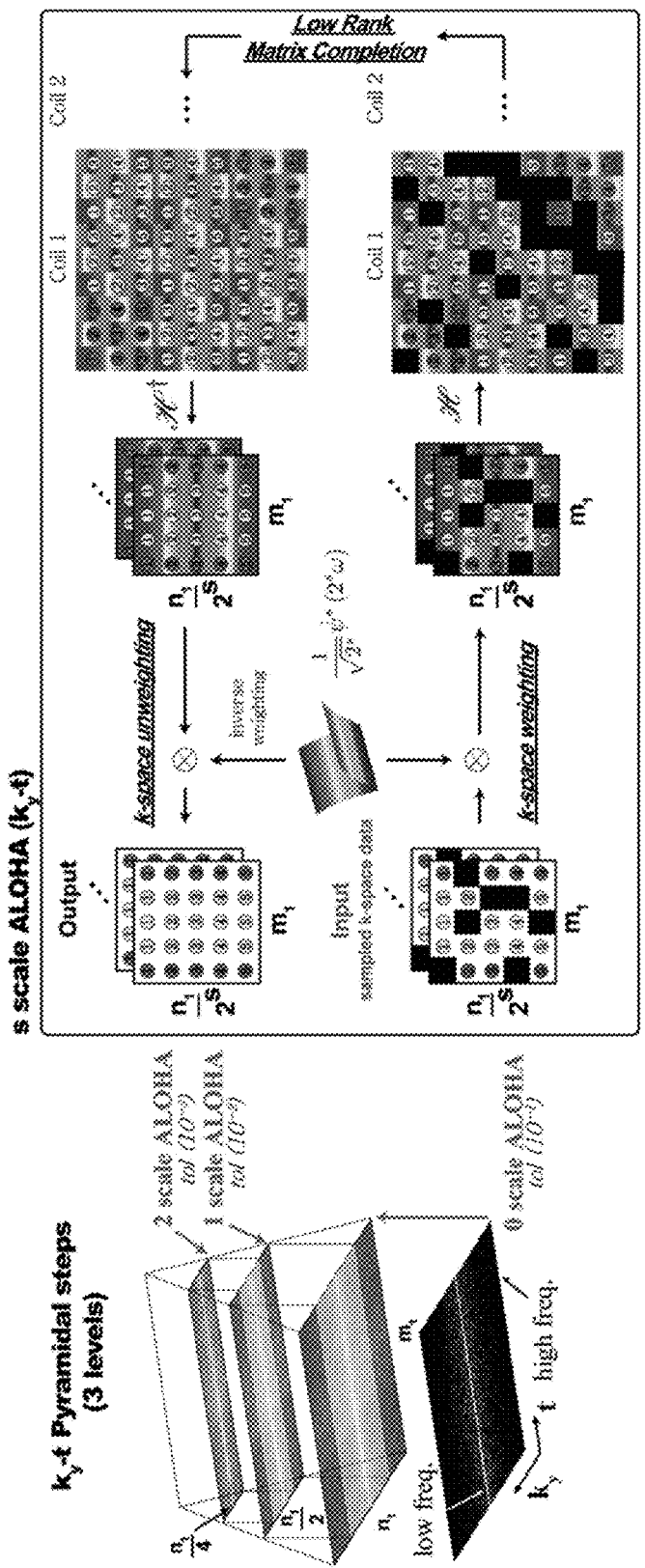

FIGS. 1A and 1B are diagrams provided to explain a process of performing a low rank reconstruction scheme using a pyramid structuralization in an image reconstruction apparatus according to an embodiment.

The image reconstruction apparatus may be an imaging apparatus including, for example, a dynamic magnetic resonance imaging (MRI) apparatus, a parallel MRI (pMRI) apparatus, a computed tomography (CT) apparatus, spectral CT apparatus, a diffraction tomography apparatus or a multi spectral diffraction tomography. The image apparatus may process multi-channel cases.

The image reconstruction apparatus may be based on an existing finite rate of innovation (FRI) model. It may be seen that an image signal in an image domain made sparse through a sparsifying operator has an annihilating filter in a dual domain. The sparsifying operator may have various forms, for example, a 1st order total variation (TV), a 2nd order total variation, or a spline wavelet. For example, an image signal may be made sparse, even when another sparsifying operator does not exist. In this example, the image signal may be represented as a one-dimensional (1D) signal of Equation 1 below.

The sparsifying operator may refer to a transform operator to allow a value distribution of an image signal to be sparse when the image signal is transformed to a domain satisfying a one-to-one correspondence.

For example, a linear transformation satisfying a one-to-one correspondence may include a wavelet transform, a total variation TV, and a Fourier transform.

$$f(x) = \sum_{j=0}^{k-1} c_j \delta(x - x_j) \quad \text{[Equation 1]}$$

In Equation 1, above, f(x) denotes an image signal, $c_j$ denotes an amplitude of an image signal, and $\delta(x-x_j)$ denotes a Dirac delta function having a support in only $x_j$. In other words, the image signal may be represented by "k" delta signals.

Equation 2 may be obtained by performing a discrete Fourier transform (DFT) on Equation 1.

$$\hat{f}[m] := \hat{f}(m\Delta) = \sum_{j=0}^{k-1} c_j e^{-i2\pi m x_j / \tau} \quad \text{[Equation 2]}$$

The image signal may have an annihilating filter $\hat{h}[n]$ in a dual domain by an FRI, and may be represented as shown in Equation 3 below.

$$(\hat{f} * \hat{h})[n] = \sum_{l=0}^{k} \hat{h}[l] \hat{f}[n-l] = 0 \quad \text{[Equation 3]}$$

In Equation 3, above, $\hat{h}[n]$ denotes an annihilating filter on which DFT is performed.

In the above convolution relationship, a rank of a convolution matrix may be proportional to a sparsity of a signal. A size of the annihilating filter may need to be greater than the sparsity of the signal at all times. However, in an FRI sampling theory, uniform time-axis sampling may be taken into consideration. In the present disclosure, a method of transforming an image signal to a Fourier domain may be provided. For example, when the annihilating filter $\hat{h}[n]$ is a finite impulse response (FIR) filter with a length of "k+1," an annihilating characteristic of the annihilating filter $\hat{h}[n]$ may be maintained despite an additional combination of the annihilating filter $\hat{h}[n]$ with a general FIR filter (tap: $k_1>1$, a size of a filter). A combined or extended filter may be represented as shown in Equation 4 below.

$$\hat{h}_a[n] = (\hat{a} * \hat{h})[n] \quad \text{[Equation 4]}$$

In equation 4, above, $\hat{h}_a[n]$ denotes an extended annihilating filter, and $\hat{a}[n]$ denotes an additional filter.

When the extended annihilating filter $\hat{h}_a[n]$ is used, a convolution matrix may be formed. A coefficient of the filter may be located in a right side of the convolution matrix based on a commutative law of convolution as shown in Equation 5, below.

$$H(\hat{f})\hat{\overline{h}}_a = 0 \qquad \text{[Equation 5]}$$

In Equation 5, above, $\hat{\overline{h}}_a$ denotes an extended annihilating filter arranged in a reverse order, and $H(\hat{f})$ denotes a convolution matrix using a signal $\hat{f}$ on which DFT is performed.

Further, $\hat{h}_a$ and $\hat{\overline{h}}_a$ may be represented as shown in Equation 6, below.

$$\hat{h}_a = [\hat{h}_a[0] \ldots \hat{h}_a[\kappa-1]]^T, \hat{\overline{h}}_a = [\hat{h}_a[\kappa-1] \ldots \hat{h}_a[0]]^T \qquad \text{[Equation 6]}$$

A convolution matrix H may be represented as shown in Equation 7, below.

$$H(\hat{f}) = \begin{bmatrix} \hat{f}[0] & \hat{f}[1] & \ldots & \hat{f}[\kappa-1] \\ \hat{f}[1] & \hat{f}[2] & \ldots & \hat{f}[\kappa] \\ \vdots & \vdots & \ddots & \vdots \\ \hat{f}[n_1-\kappa] & \hat{f}[n_1-\kappa+1] & \ldots & \hat{f}[n_1-1] \end{bmatrix} \in \mathbb{C}^{(n_1-\kappa+1)\times\kappa} \qquad \text{[Equation 7]}$$

A relationship shown in Equation 5 may be regarded as a low rank matrix completion problem, which may be represented as shown in Equation 8, below.

$$\min_{m \in \mathbb{C}^n} \|H(m)\|_* \qquad \text{[Equation 8]}$$
$$\text{s.t. } P_\Omega(m) = P_\Omega(\hat{f})$$

In Equation 8, above, $\|\cdot\|_*$ denotes a nuclear norm of an input. $P_\Omega(\cdot)$ denotes a value at a sampling position, and $H(\cdot)$ denotes a convolution matrix of an input. The low rank matrix completion problem may be the same as an existing spectral compressed sensing problem.

According to an embodiment, in an example, an image signal may be sparse in a specific domain even though the image signal is not sparse in an image domain. In this example, a TV operator may be used.

$$L := a_K D^K + a_{K-1} D^{K-1} + \ldots + a_1 D^1 + a_0 \qquad \text{[Equation 9]}$$

In equation 9, above, D denotes a differential operator, and $a_k$ denotes a real number. A generalized TV semi-norm for the above operator may be represented as shown in Equation 10, below.

$$\|f\|_{TV(L;E)} := \|Lf\|_{L_1(E)} = \sup_{h \in C_h} \int_E Lf(x)h(x)dx \qquad \text{[Equation 10]}$$

When a signal is assumed to be sparse in the above TV domain, the signal may be represented as shown in Equation 11, below.

$$Lf(x) = \sum_{j=0}^{k-1} a_j \delta(x - x_j) \qquad \text{[Equation 11]}$$

In Equation 11, above, Lf(x) denotes a differentiated signal in an image domain, and $a_j$ denotes a differential coefficient of a position $x_j$.

The differentiated signal of Equation 11 may be represented as a limitative sinusoidal sum in a Fourier domain.

$$F\{Lf(x)\} = \hat{l}(\omega)\hat{f}(\omega) = \sum_{j=0}^{k-1} a_j e^{-i\omega x_j} \qquad \text{[Equation 12]}$$

In Equation 12, above, $F\{\cdot\}$ denotes a Fourier transform, and $\hat{l}(\omega)$ denotes a Fourier transformed differential operator.

$$\hat{l}(\omega) = a_K(i\omega)^K + a_{K-1}(i\omega)^{K-1} + \ldots + a_0 \qquad \text{[Equation 13]}$$

Accordingly, a conditional part of a low rank matrix completion problem based on an annihilating filter of the above signal may be different from that of a problem of Equation 5.

$$\min_{m \in \mathbb{C}^n} \|H(m)\|_* \qquad \text{[Equation 14]}$$
$$\text{s.t. } P_\Omega(m) = P_\Omega(\hat{l} \odot \hat{f})$$

In Equation 14, above, $\odot$ denotes an operator involving a Hadamard product, and $\hat{l}$, $\hat{f}$ denote discrete vectors of $\hat{l}(\omega)$, $\hat{f}(\omega)$. In the above generalized version, $\hat{l}(\omega) = i\omega$ may be satisfied in a piecewise constant signal, and it may be seen that $\hat{l}(\omega) = (i\omega)^d$ is satisfied when a signal corresponds to non-uniform splines (order d).

In another example in which an image signal is sparse in a specific domain, not in an image domain, a dyadic wavelet may be used. The image signal may be represented by a specific mother wavelet as shown in Equation 15, below.

$$f(x) = \sum_{l \in \mathbb{Z}} \sum_{s \in \mathbb{Z}} \langle f, \psi_{s,l} \rangle \tilde{\psi}_{s,l}(x), \qquad \text{[Equation 15]}$$
$$\psi_{s,l} = 2^{-s/2} \psi(x/2^s - l)$$

In Equation 15, above, $\psi_{s,l}$ denotes an s-scale, l shifted wavelet function, $\langle \cdot \rangle$ denotes an inner product operator, and $\langle f, \psi_{s,l} \rangle$ denotes a wavelet coefficient of an image signal f.

Each wavelet may be represented based on a bi-orthogonality as shown in Equation 16 below.

$$(\overline{\psi}_s * f)(x)|_{x=2^s l} = \langle f, \psi_{s,l} \rangle = c_{sl} \qquad \text{[Equation 16]}$$

This may be represented in a Fourier domain as shown in Equation 17, below.

$$\sum_l c_{sl} e^{-i\omega 2^s l} = \frac{1}{2^s} \sum_{n=0}^{2^s-1} \overline{\psi}_s^* \left(\omega + n\frac{2\pi}{2^s}\right) f\left(\omega + n\frac{2\pi}{2^s}\right) \qquad \text{[Equation 17]}$$

In Equation 17, above, $$\sum_l c_{sl} e^{-i\omega 2^s l}$$

denotes a Fourier-transformed wavelet coefficient, and $$\sum_{n=0}^{2^s-1} \bar{\psi}_s^*\left(\omega + n\frac{2\pi}{2^s}\right) f\left(\omega + n\frac{2\pi}{2^s}\right)$$

indicates that a Fourier signal is repetitively represented when the wavelet function $\psi_{s,l}$ and a Fourier coefficient $f(\omega)$ of an image signal are Fourier-transformed by an s-scale.

When $c_{sl}$ is assumed as a sparse signal represented as a sum of Dirac delta functions, a sparse signal may have an annihilating filter. Unlike the above-described generalized TV domain, a domain of the dyadic wavelet may apply a pyramidal decomposition framework. A size of a region on which weighting is performed in a k-space may be reduced based on a level by a wavelet repeated by n in Equation 17. A size of a patch may be reduced in stages based on a level and accordingly, an amount of calculation may be reduced.

The patch may refer to a partial signal obtained by cropping a specific region from an image signal or a k-space signal.

When the pyramidal decomposition framework is applied, different reconstructions may be performed based on a signal-to-noise ratio (SNR) in stages based on levels, which may reduce a number of iterations of a low rank matrix completion algorithm of an iterative reconstruction scheme.

Another annihilating characteristic may be obtained from a relationship expression between multi-channel data. The above characteristic may be used in a pMRI apparatus, a spectral CT apparatus, or a multi-spectral diffraction tomography apparatus. A signal $g_i(x)$ obtained from multiple channels may be represented in an image domain as shown in Equation 18, below.

$$g_i(x) = s_i(x)f(x), \; i=1,\ldots,r \qquad \text{[Equation 18]}$$

In Equation 18, above, $s_i(x)$ denotes an i-th coil sensitivity map or spectrum map, $f(x)$ denotes a target image that is not yet known, and $r$ denotes a total number of coils and/or spectra.

In an MRI, $s_i(x)$ denotes a coil sensitivity map. In a spectral CT or diffraction tomography, $s_i(x)$ denotes a spectral map.

When a differential operator is applied to Equation 18, a distributive law may be established as shown in Equation 19, below.

$$Lg_i(x) = s_i(x)Lf(x) + f(x)Ls_i(x) \qquad \text{[Equation 19]}$$

When a coil sensitivity map or spectrum map belong to a null space of an operator L based on a slowly changing function, a second term in the right hand side of Equation 19 may be ignored as shown in Equation 20, below.

$$Lg_i(x) = s_i(x)Lf(x), \; i=1,\ldots,r \qquad \text{[Equation 20]}$$

A relationship shown in Equation 21 below may be formed based on an interrelationship between coil sensitivity maps or spectrum maps.

$$s_j(x)Lg_i(x) = s_i(x)Lg_j(x), \; i,j=1,\ldots,r, \text{ and } i \neq j \qquad \text{[Equation 21]}$$

When a Fourier transform is performed on Equation 21 in a k-space, Equation 22 may be obtained as shown below.

$$\hat{s}_j(\omega) * (\hat{l}(\omega)\hat{g}_i(\omega)) - \hat{s}_i(\omega) * (\hat{l}(\omega)\hat{g}_j(\omega)) = 0, \; i \neq j, \; \forall \omega \qquad \text{[Equation 22]}$$

Equation 22 may correspond to an effect of augmenting a Hankel matrix generated from each channel, and the augmented Hankel matrix may be represented as shown in Equation 23, below.

$$y = [H(\hat{l} \odot \hat{g}_1) \ldots H(\hat{l} \odot \hat{g}_r)] \in \mathbb{C}^{(n_1-\kappa+1) \times \kappa\gamma} \qquad \text{[Equation 23]}$$

In Equation 23, above, y denotes an augmented Hankel matrix.

The Hankel matrix of Equation 23 may be a rank deficient matrix and accordingly, may be interpreted as a problem to solve the problem of rank deficient matrix.

$$\min_{(m_i)_{i=1}^r} \|[H(m_1) \ldots H(m_r)]\|_* \qquad \text{[Equation 24]}$$

$$\text{s.t. } P_\Omega(m_i) = P_\Omega(\hat{l} \odot \hat{g}_i),$$

$$i = 1, \ldots, r$$

In other words, a problem of reconstructing an incomplete matrix y may be represented as shown in Equation 24.

The above annihilating filter coefficient may be multiplied by the augmented matrix, to represent an annihilating characteristic.

$$yS_1 = 0, \qquad \text{[Equation 25]}$$

The annihilating filter coefficient may be obtained by an interrelationship between multiple coils as shown in Equations 26 and 27 below.

$$S_{r-1} \triangleq \begin{bmatrix} \hat{s}_r \\ -\hat{s}_{r-1} \end{bmatrix} \qquad \text{[Equation 26]}$$

$$S_t \triangleq \begin{bmatrix} \hat{s}_{t+1} & \hat{s}_{t+1} & \ldots & \hat{s}_r & 0 \\ -\hat{s}_t & & & & \\ & -\hat{s}_t & & & S_{t+1} \\ & & \ddots & & \\ & & & -\hat{s}_t & \end{bmatrix} \qquad \text{[Equation 27]}$$

Equations 26 and 27, above, may show that various annihilating filters may be obtained. Due to the above relationship expression, multiple channels may have a lower rank than a single channel.

A vector in Equation 27 may be a vector representing an interactively annihilating characteristic as a combinatorial coefficient by Equation 21.

When the above Hankel matrix structure is extended to a two-dimensional (2D) signal, and when an annihilating filter $\hat{h}[n, m]$ is assumed as a 2D FIR filter with a $p_1 \times q_1$ size, a convolution relationship between the signal and the annihilating filter may be formed as shown in Equation 28, below.

$$(\hat{f} * \hat{h})[n, m] = \sum_{i=0}^{p_1-1} \sum_{j=0}^{q_1-1} \hat{h}[i, j]\hat{f}[n-i, m-j] = 0, \qquad \text{[Equation 28]}$$

$$\forall n, m \in \Omega$$

Equation 28 may be obtained by extending Equation 3 with a convolution operator in a 1D signal to a 2D signal.

For example, a 2D signal in a k-space may be represented as shown in Equation 29 below.

$$F := \begin{bmatrix} \hat{f}[0, 0] & \ldots & \hat{f}[0, m_1-1] \\ \vdots & \ddots & \vdots \\ \hat{f}[n_1-1, 0] & \ldots & \hat{f}[n_1-1, m_1-1] \end{bmatrix} = \qquad \text{[Equation 29]}$$

-continued $$[\hat{f} \quad \ldots \quad \hat{f}_{m_1-1}] \in \mathbb{R}^{n_1 \times m_1}$$

In this example, a convolution expression may be represented by a matrix-vector relationship shown in Equation, 30 below.

$$H(\hat{F})\hat{h}=0 \qquad \text{[Equation 30]}$$

Here, a convolution matrix may be given as shown in Equations 31 and 32 below.

$$H(\hat{F}) = \begin{bmatrix} H(\hat{f}_0) & H(\hat{f}_1) & \ldots & H(\hat{f}_{q_1-1}) \\ H(\hat{f}_1) & H(\hat{f}_2) & \ldots & H(\hat{f}_{q_1}) \\ \vdots & \vdots & \ddots & \ldots \\ H(\hat{f}_{m_1-q_1}) & H(\hat{f}_{m_1-q_1+1}) & \ldots & H(\hat{f}_{m_1-1}) \end{bmatrix} \in \qquad \text{[Equation 31]}$$

$$\mathbb{C}^{(m_1-q_1+1)(n_1-p_2+1) \times p_1 q_1}$$

$$H(\hat{f}_j) = \qquad \text{[Equation 32]}$$

$$\begin{bmatrix} \hat{f}[0, j] & \hat{f}[1, j] & \ldots & \hat{f}[p_1-1, j] \\ \hat{f}[1, j] & \hat{f}[2, j] & \ldots & \hat{f}[p_1, j] \\ \vdots & \vdots & \ddots & \vdots \\ \hat{f}[n_1-p_1, j] & \hat{f}[n_1-p_1+1, j] & \ldots & \hat{f}[n_1-1, j] \end{bmatrix} \in$$

$$\mathbb{C}^{(n_1-p_1+1) \times p_1}$$

The annihilating filter may be given as shown in Equation 33, below.

$$\hat{h} = \overline{VEC(\hat{H})} \qquad \text{[Equation 33]}$$

In an example of multi-channel data, a multi-channel convolution matrix may be obtained by augmenting a Hankel matrix to a side of the above convolution matrix.

Typical low rank matrix completion algorithms may be used to find a solution to a problem of lowering a nuclear norm, that is, a sum of singular values, whereas in the present disclosure, a nuclear norm may be represented as shown in Equation 34 below.

$$\|A\|_* = \min_{U,V:A=UV^H} \|U\|_F^2 + \|V\|_F^2 \qquad \text{[Equation 34]}$$

In Equation 34, above, $\|\cdot\|_F$ denotes a Frobenius norm of a matrix, A denotes a Hankel matrix, and U,V denote factorized matrices satisfying $A=UV^H$. Accordingly, to obtain a minimum rank matrix of a block Hankel matrix, the following problem may be set.

$$\min_X \|U\|_F^2 + \|V\|_F^2 \qquad \text{[Equation 35]}$$
$$\text{s.t. } H\{X\} = UV^H$$
$$X(i, j) = M(i, j),$$
$$\forall (i, j) \in \Omega$$

In Equation 35, above, M(i,j) denotes a sampled signal, and $\forall (i,j) \in \Omega$ denotes an index of a sampled position.

A solution to the set problem may be obtained using an alternating direction method of multiplier (ADMM) algorithm, and may be rearranged based on an ADMM as shown in Equation 36 below.

$$L(U, V, X, \Lambda) := \qquad \text{[Equation 36]}$$
$$\iota_C(X) + \frac{1}{2}(\|U\|_F^2 + \|V\|_F^2) + \frac{\mu}{2}\|H\{X\} - UV^H + \Lambda\|_F^2$$

In Equation 36, above, $\iota_C(X)$ denotes an indicator function, and may be represented as shown in Equation 37, below.

$$\iota_C(X) = \begin{cases} 0, & \text{if } X \in \Omega \\ \infty, & \text{otherwise} \end{cases} \qquad \text{[Equation 37]}$$

Also, $\Lambda$ denotes a Lagrangian variable, and $\Omega$ denotes a sampled position.

The ADMM may be used to obtain a solution X to minimize a cost function obtained by combining condition terms into a single term, and may be obtained through the following iteration:

$$X^{(k+1)} = \arg\min_X \iota_C(X) + \frac{\mu}{2}\|H\{X\} - U^{(k)}V^{(k)H} + \Lambda^{(k)}\|_F^2 \qquad \text{[Equation 38]}$$

$$U^{(k+1)} =$$
$$\arg\min_U \frac{1}{2}\|U\|_F^2 + \frac{\mu}{2}\|H\{X^{(k+1)}\} - UV^{(k)H} + \Lambda^{(k)}\|_F^2$$

$$V^{(k+1)} = \arg\min_V \frac{1}{2}\|V\|_F^2 +$$
$$\frac{\mu}{2}\|H\{X^{(k+1)}\} - U^{(k+1)}V^H + \Lambda^{(k)}\|_F^2$$

$$\Lambda^{(k+1)} = H\{X^{(k+1)}\} - U^{(k+1)}V^{(k+1)H} + \Lambda^{(k)}$$

Each of variables in Equation 38, above, may be sequentially minimized using the ADMM algorithm. The above cost functions may be separate from each other and may obtain a solution. A closed form of each of the variables may be represented as shown in Equation 39 below.

$$X^{(k+1)}=P_{\Omega^c}H^+\{U^{(k)}V^{(k)H}-\Lambda^{(k)}\}+P_\Omega M$$

$$U^{(k+1)}=\mu(H\{X^{(k+1)}\}+\Lambda^{(k)})V^{(k)}(I+\mu V^{(k)H}V^{(k)})^{-1}$$

$$V^{(k+1)}=\mu(H\{X^{(k+1)}\}+\Lambda^{(k)})^H U^{(k+1)}(I+\mu U^{(k+1)H}U^{(k+1)})^{-1} \qquad \text{[Equation 39]}$$

In Equation 39, above, $P_{\Omega^c}$ denotes a projector to a region other than $\Omega$, $P_\Omega$ denotes a projector to a position $\Omega$, and $H^+$ denotes Penrose-Moore pseudo-inverse mapping and may be represented as shown in Equation 40, below.

$$H^+=(H^*H)^{-1}H^* \qquad \text{[Equation 40]}$$

An adjoint operator H* may function to add all original patch values overlapping in a block Hankel matrix and to put a sum of the original patch values into the original position, and $(H^*H)^{-1}$ may function to perform division by a number of times the original patch values overlap. Accordingly, $H^+$ may function to obtain an average value of values overlapping in the block Hankel matrix and to place the average value in the original patch. Initial values $U^0, V^0$ may be determined based on a plurality of rank estimation algorithms or a predetermined rank. The above algorithm may correspond to a single patch. Thus, it is possible to reconstruct a lost block Hankel matrix y using the above algorithm, instead of needing to calculate coefficients of two types of annihilating filters.

Referring to FIG. 1A, a proposed low rank matrix completion algorithm may be efficiently calculated based on a pyramid structuralization scheme. The low rank matrix completion algorithm may be calculated for an independent patch. When a pyramid structure of FIG. 1A is used, a size of a patch may be reduced in stages and different reconstructions may be performed for each stage based on an SNR, which may lead to a reduction in a number of iterations of the low rank matrix completion algorithm using an iterative reconstruction scheme. The above pyramid structuralization may be applied to a $k_x$-$k_y$ domain. In the pyramid structuralization, as a pyramid stage increases, a patch including a central frequency and having a horizontal length and a vertical length that are reduced to half those of a patch in a previous stage may be generated. Also, in the pyramid structuralization, information reconstructed in the previous stage may be used as initial information to perform reconstruction in a current stage. Use of the initial information may have an influence on enhancement of a reconstruction performance.

When the pyramid structuralization is applied to a $k_y$-t domain, a patch having a rectangular shape and including a low frequency portion may be formed for each stage as shown in FIG. 1B, and a process, for example, $k_x$-$k_y$ may be performed.

To reconstruct a block Hankel patch matrix having the above pyramid structure through a low rank matrix completion, a plurality of operators may be used. The above relationship may be induced from the above-described FRI model. Actually, the above k-space weighting may be used to emphasize edge information of an image, and the edge information may be sparser than a typical image.

Figure 2:
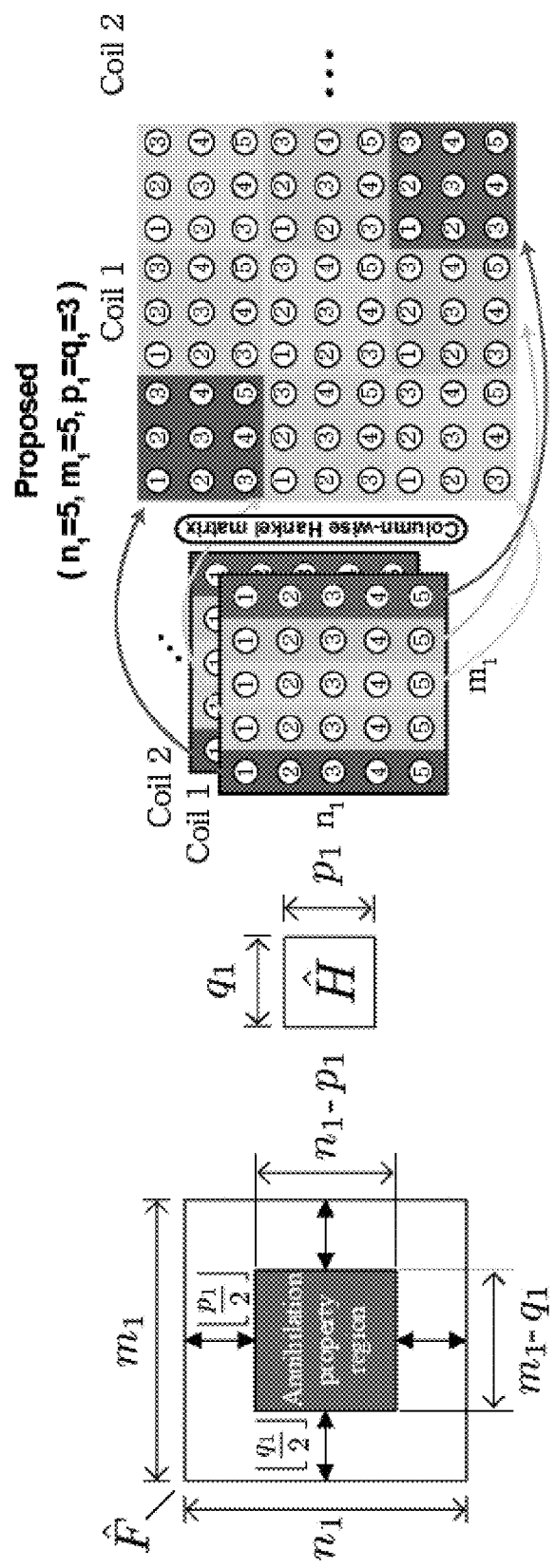
FIG. 2 is a diagram illustrating a region to which an annihilating filter is applied, and a process of forming a block Hankel matrix according to an embodiment.

FIG. 2 illustrates a region to which an annihilating filter is applied, and a process of forming a block Hankel matrix according to an embodiment.

Figure 3:
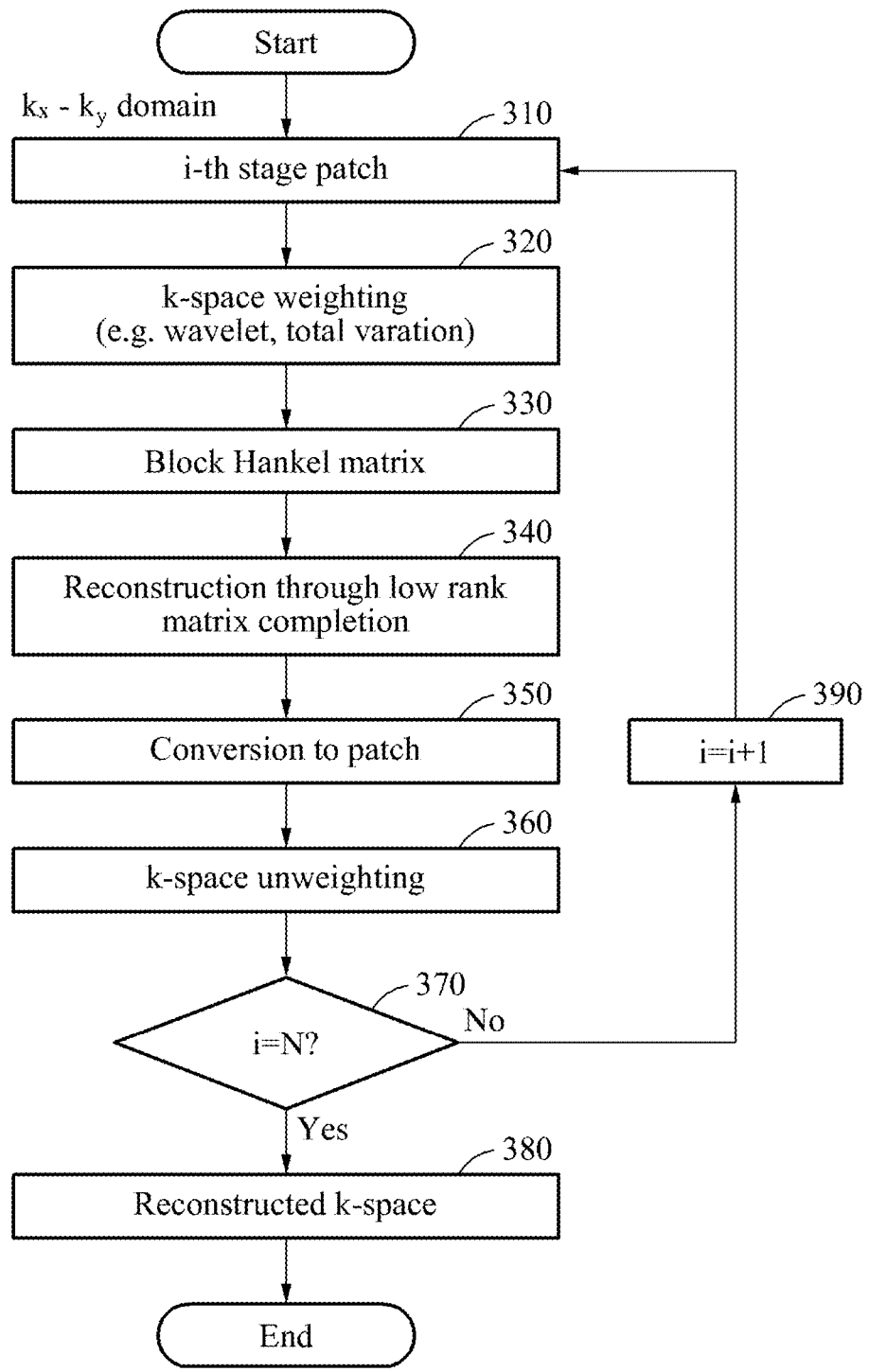
FIG. 3 is a flowchart illustrating an example of a reconstruction process according to an embodiment.

FIG. 3 is a flowchart illustrating a reconstruction process performed in a $k_x$-$k_y$ domain according to an embodiment. An image reconstruction apparatus according to an embodiment may perform operations 310 through 390 to reconstruct an image. The image reconstruction apparatus may minimize an amount of calculation to reconstruct an image through processing for each of patches forming a pyramid structure. In operation 310, the image reconstruction apparatus may generate an i-th stage patch in the pyramid structure. In operation 320, the image reconstruction apparatus may sparsely convert an original image in an image domain by performing a variety of weighting on k-space data. In operation 330, the image reconstruction apparatus may convert lost k-space data into a block Hankel matrix based on presence of an annihilating filter in a k-space and a commutative law of a convolution operation in a domain of the k-space. Operation 330 may be understood as converting a problem needing to be solved for image reconstruction into a problem needing to be solved for completion of a deficient rank in the block Hankel matrix. In operation 340, the image reconstruction apparatus may solve a rank deficient problem using various low rank matrix completion algorithms.

A patch in a lowest stage of the pyramid structure may correspond to the entire k-space.

In operations 350 through 390, the image reconstruction apparatus may reconstruct the entire k-space using a matrix completion algorithm.

When the entire k-space is reconstructed, the image reconstruction apparatus may reduce a size of a patch based on a direct current (DC) value, may initialize values reconstructed in a first stage, and may accurately reconstruct a low frequency region using the matrix completion algorithm again.

The image reconstruction apparatus may apply different stopping criteria for each stage in the pyramid structure. For example, the image reconstruction apparatus may apply a low stopping criterion to a patch in a stage with a large amount of noise among patches to which the pyramid structure is applied, to reduce a level of contribution of noise in a reconstructed signal. In another example, the image reconstruction apparatus may apply a high stopping criterion to a patch from which a low frequency region is cut, to increase a level of contribution of a signal in a reconstructed signal. In this example, the image reconstruction apparatus may reconstruct the entire k-space based on reconstructed patches of each stage. The image reconstruction apparatus may perform k-space weighting before reconstruction is performed for each of the patches, and may perform k-space unweighting after a patch is reconstructed.

The image reconstruction apparatus may convert k-space data acquired using a multi-image capturing apparatus into a block Hankel matrix, and may reconstruct an image based on the block Hankel matrix. The multi-image capturing apparatus may include, for example, a pMRI apparatus, a spectral CT apparatus, or a multi-spectral diffraction tomography apparatus. The image reconstruction apparatus may perform k-space weighting on each of pyramid patches of a k-space acquired from multiple coils, and may independently perform k-space unweighting on each of the pyramid patches for each coil and/or spectrum after an image is reconstructed.

Figure 4:
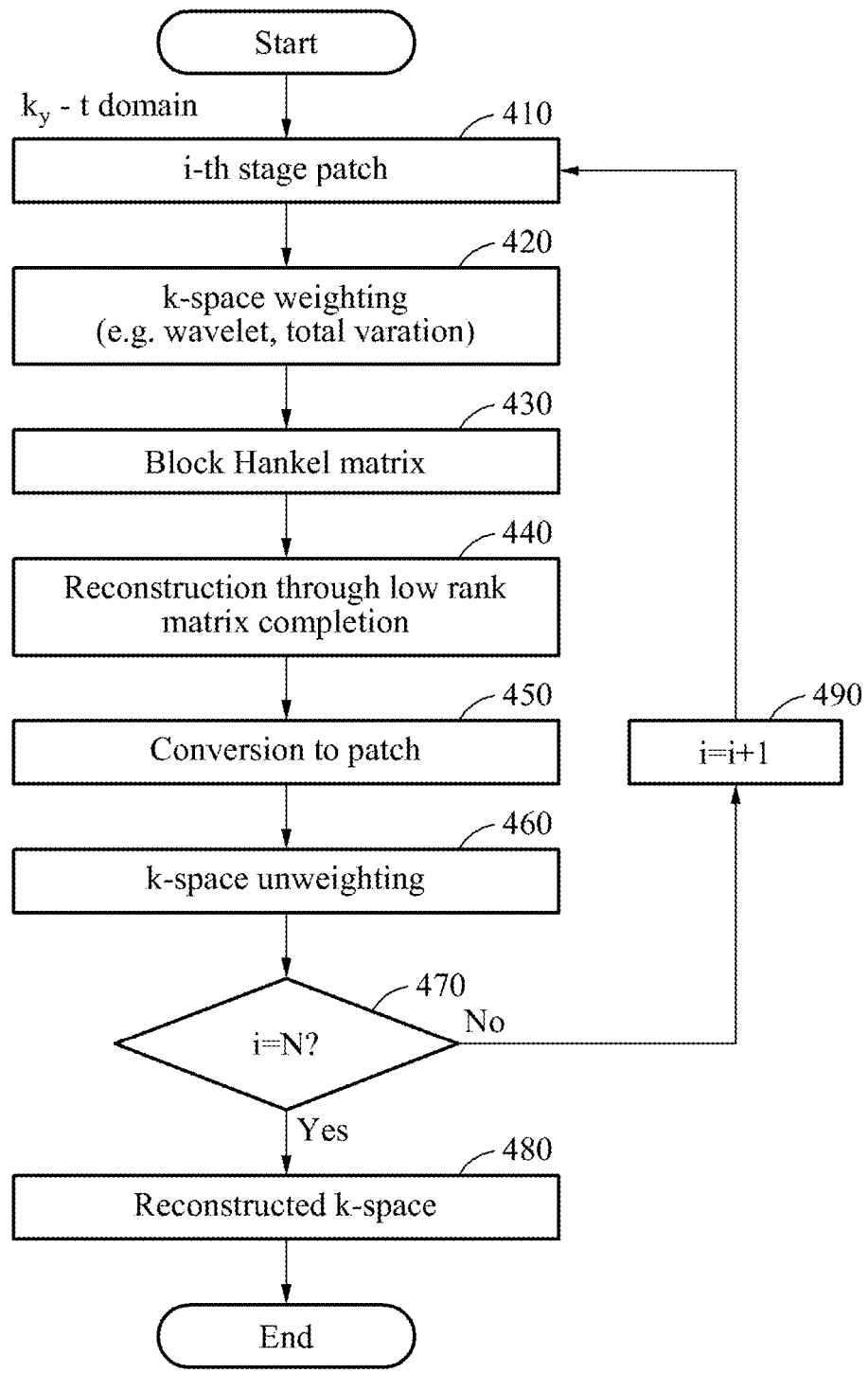
FIG. 4 is a flowchart illustrating another example of a reconstruction process according to an embodiment.

FIG. 4 is a flowchart illustrating a reconstruction process performed in a $k_y$-t domain according to an embodiment. An image reconstruction apparatus according to an embodiment may perform operations 410 through 490 to reconstruct an image. The image reconstruction apparatus may also apply operations 410 through 490 to a multi-channel image.

The image reconstruction apparatus may minimize an amount of calculation to reconstruct an image through processing for each of patches forming a pyramid structure. In operation 410, the image reconstruction apparatus may generate an i-th stage patch in the pyramid structure. In operation 420, the image reconstruction apparatus may sparsely convert an original image in an image domain by performing a variety of weighting on k-space data. In operation 430, the image reconstruction apparatus may convert lost k-space data into a block Hankel matrix based on presence of an annihilating filter in a k-space and a commutative law of a convolution operation in a domain of the k-space. Operation 440 may be understood as converting a problem needing to be solved for image reconstruction into a problem needing to be solved for completion of a deficient rank in the block Hankel matrix. In operation 440, the image reconstruction apparatus may solve a rank deficient problem using various low rank matrix completion algorithms. In operation 450, the image reconstruction apparatus may select a patch based on a DC line in each stage while reducing a size of a patch in a $k_y$ direction. In operation 460, the image reconstruction apparatus may reconstruct the entire k-space using reconstructed patches of each stage.

Figure 5:
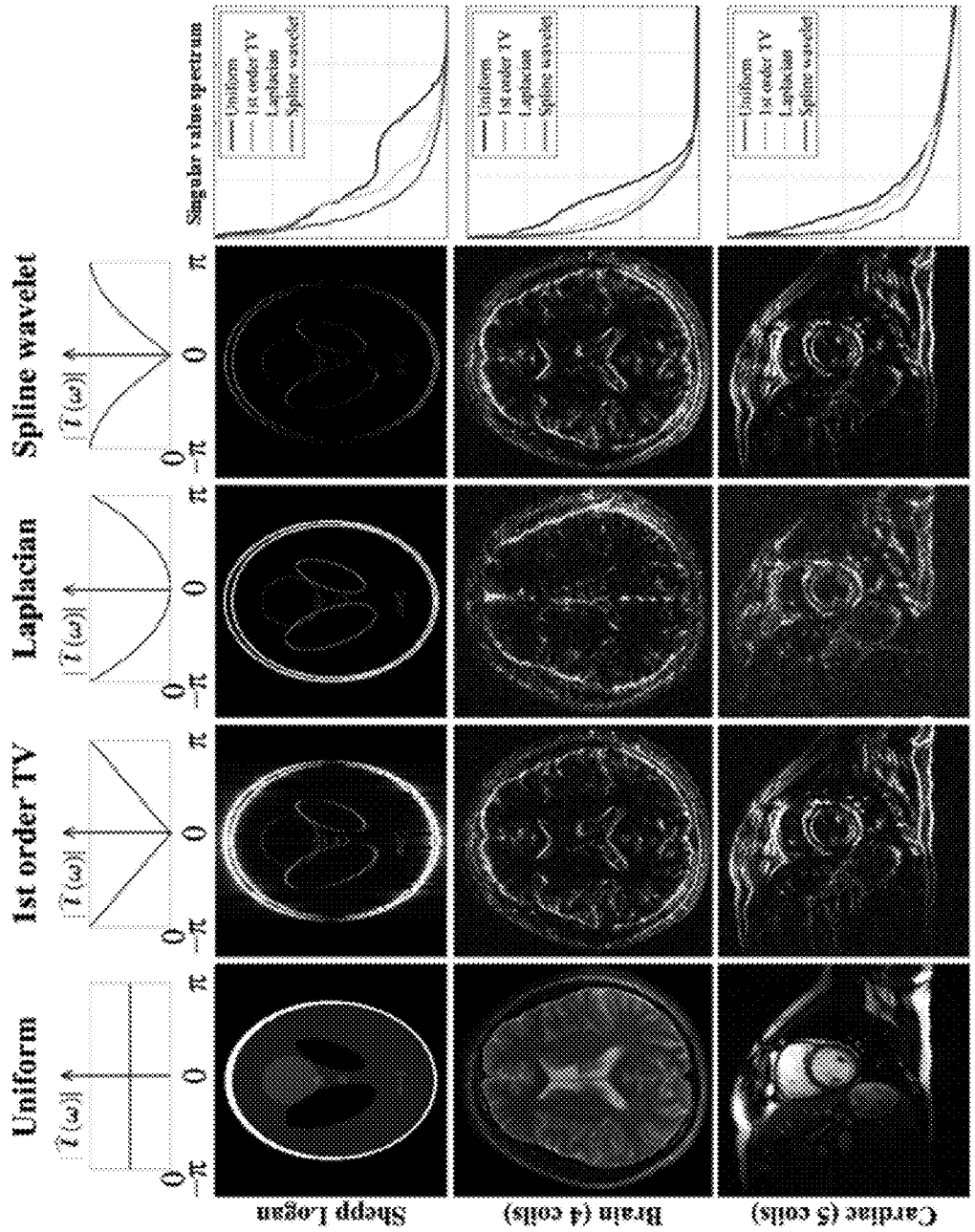
FIG. 5 is a diagram illustrating a change in a distribution of singular values of a block Hankel matrix by a plurality of operators in an image reconstruction apparatus according to an embodiment.

FIG. 5 is a diagram illustrating a change in a distribution of singular values of a block Hankel matrix by a plurality of operators in an image reconstruction apparatus according to an embodiment.

Figure 6:
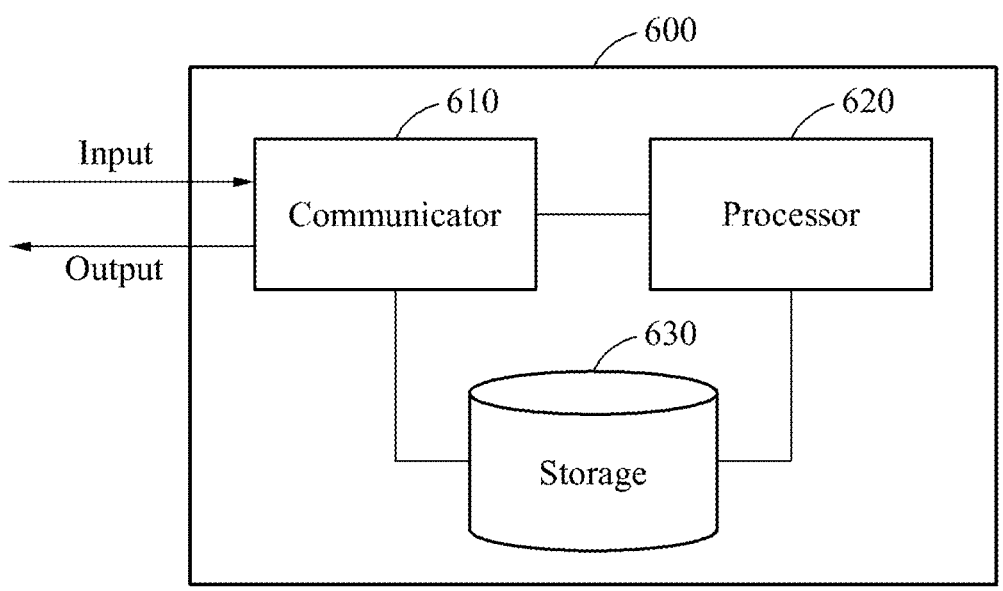
FIG. 6 is a block diagram illustrating a configuration of an image reconstruction apparatus according to an embodiment.

FIG. 6 is a block diagram illustrating a configuration of an image reconstruction apparatus 600 according to an embodiment.

Referring to FIG. 6, the image reconstruction apparatus 600 may include a communicator 610, a processor 620, and a storage 630.

The communicator 610, the processor 620 and the storage 630 may perform functions of the image reconstruction apparatus described above with reference to FIGS. 1 through 5 and accordingly, further description thereof will be omitted here.

The communicator 610 may receive lost k-space data from an imaging apparatus.

The processor 620 may reconstruct an image based on the received k-space data.

According to embodiments, an image reconstruction apparatus may reconstruct data of an image based on information of a k-space. The above algorithm may be applied to both data acquired using a single channel and data acquired using multiple channels.

In addition, according to embodiments, an image reconstruction apparatus may perform a reconstruction based on both sparsity of coefficients generated from various operators in an image domain and a relationship between multiple coils and thus, it is possible to provide a clearly reconstructed image in comparison to existing algorithms.

The units described herein may be implemented using hardware components, software components, or a combination thereof. A processing device may be implemented using one or more general-purpose or special purpose computers, such as, for example, a processor, a controller and an arithmetic logic unit, a digital signal processor, a microcomputer, a field programmable array, a programmable logic unit, a microprocessor or any other device capable of responding to and executing instructions in a defined manner. The processing device may run an operating system (OS) and one or more software applications that run on the OS. The processing device also may access, store, manipulate, process, and create data in response to execution of the software. For purpose of simplicity, the description of a processing device is used as singular; however, one skilled in the art will appreciated that a processing device may include multiple processing elements and multiple types of processing elements. For example, a processing device may include multiple processors or a processor and a controller. In addition, different processing configurations are possible, such a parallel processors.

The software may include a computer program, a piece of code, an instruction, or some combination thereof, to independently or collectively instruct or configure the processing device to operate as desired. Software and data may be embodied permanently or temporarily in any type of machine, component, physical or virtual equipment, computer storage medium or device, or in a propagated signal wave capable of providing instructions or data to or being interpreted by the processing device. The software also may be distributed over network coupled computer systems so that the software is stored and executed in a distributed fashion. The software and data may be stored by one or more non-transitory computer readable recording mediums.

The method according to the above-described embodiments of the present invention may be recorded in non-transitory computer-readable media including program instructions to implement various operations embodied by a computer. The media may also include, alone or in combination with the program instructions, data files, data structures, and the like. The program instructions recorded on the media may be those specially designed and constructed for the purposes of the embodiments, or they may be of the kind well-known and available to those having skill in the computer software arts. Examples of non-transitory computer-readable media include magnetic media such as hard disks, floppy disks, and magnetic tape; optical media such as CD ROM disks and DVDs; magneto-optical media such as optical discs; and hardware devices that are specially configured to store and perform program instructions, such as read-only memory (ROM), random access memory (RAM), flash memory, and the like. Examples of program instructions include both machine code, such as produced by a compiler, and files containing higher level code that may be executed by the computer using an interpreter. The described hardware devices may be configured to act as one or more software modules in order to perform the operations of the above-described embodiments of the present invention, or vice versa.

Although a few exemplary embodiments of the present invention have been shown and described, the present invention is not limited to the described exemplary embodiments. Instead, it would be appreciated by those skilled in the art that changes may be made to these exemplary embodiments without departing from the principles and spirit of the invention, the scope of which is defined by the claims and their equivalents.

What is claimed is:

1. A method of reconstructing an image, the method comprising:
   acquiring lost k-space data using an imaging apparatus capable of acquiring k-space data; and
   reconstructing the image by interpolating additional Fourier data based on the lost k-space data using a low rank matrix completion algorithm,
   wherein the imaging apparatus comprises at least one of a magnetic resonance imaging (MRI) apparatus, a computed tomography (CT) apparatus, and a diffraction tomography apparatus, and
   wherein the reconstructing the image comprises converting each of a plurality of pyramid patches into a block Hankel matrix and reconstructing the image using a plurality of minimum rank matrix completion algorithms, the plurality of pyramid patches forming a pyramid structure.

2. The method of claim 1, wherein the reconstructing of the image comprises:
   assigning weights to the lost k-space data based on a feature of a sparsifying transform of an existing image corresponding to the lost k-space data, and
   generating the existing image, wherein the existing image is a sparsified image.

3. The method of claim 1, wherein a first pyramid patch in the pyramid structure corresponds to an entire k-space, and
   wherein the reconstructing of the image comprises:
   reconstructing the entire k-space using a matrix completion algorithm,
   generating a second pyramid patch by reducing a size of the first pyramid patch based on a direct current (DC) value in the reconstructed k-space,
   setting reconstructed values of the first pyramid patch as initial values, and
   reconstructing a low frequency region of the k-space based on the initial values using the matrix completion algorithm.

4. The method of claim 1, wherein the reconstructing of the image comprises applying different stopping criteria for each of the plurality of pyramid patches, and wherein the applying of the different stopping criteria comprises:
applying a stopping criterion equal to or less than a preset criterion to a pyramid patch comprising an amount of noise equal to or greater than a preset amount among the plurality of pyramid patches, and
applying a stopping criterion equal to or greater than the preset criterion to a pyramid patch from which a low frequency region is cut among the plurality of pyramid patches.

5. The method of claim 4, wherein the reconstructing of the image comprises:
performing k-space weighting on each of the plurality of pyramid patches in a k-space acquired from multiple coils or multiple spectra, and
independently performing k-space unweighting on each of the plurality of pyramid patches after reconstructing of the block Hankel matrix corresponding to each of the plurality of pyramid patches.

6. The method of claim 1, wherein the k-space data is acquired from multiple coils of the imaging apparatus.

7. An apparatus for reconstructing an image, the apparatus comprising:
a processor configured to:
acquire lost k-space data using an imaging apparatus capable of acquiring k-space data, and
reconstruct the image by interpolating additional Fourier data based on the lost k-space data using a low rank matrix completion algorithm,
wherein the imaging apparatus comprises at least one of a magnetic resonance imaging (MRI) apparatus, a computed tomography (CT) apparatus, and a diffraction tomography apparatus, and
wherein the processor converts each of a plurality of pyramid patches into a block Hankel matrix and reconstructs the image using a plurality of minimum rank matrix completion algorithms, the plurality of pyramid patches forming a pyramid structure.

8. The apparatus of claim 7, wherein the processor:
assigns weights to the lost k-space data based on a feature of a sparsifying transform of an existing image corresponding to the lost k-space data, and
generates the existing image, wherein the existing image is a sparsified image.

9. The apparatus of claim 7, wherein a first pyramid patch in the pyramid structure corresponds to an entire k-space, and
wherein the processor:
reconstructs the entire k-space using a matrix completion algorithm,
generates a second pyramid patch by reducing a size of the first pyramid patch based on a direct current (DC) value in the reconstructed k-space,
sets reconstructed values of the second pyramid patch as initial values, and
reconstructs a low frequency region of the k-space based on the initial values using the matrix completion algorithm.

10. The apparatus of claim 7, wherein the processor applies different stopping criteria for each of the plurality of pyramid patches, and
wherein the processor:
applies a stopping criterion equal to or less than a preset criterion to a pyramid patch comprising an amount of noise equal to or greater than a preset amount among the plurality of pyramid patches, and
applies a stopping criterion equal to or greater than the preset criterion to a pyramid patch from which a low frequency region is cut among the plurality of pyramid patches.

11. The apparatus of claim 10, wherein the processor:
performs k-space weighting on each of the plurality of pyramid patches in a k-space acquired from multiple coils or multiple spectra, and
independently performs k-space unweighting on each of the plurality of pyramid patches after reconstructing of the block Hankel matrix corresponding to each of the plurality of pyramid patches.

12. The apparatus of claim 7, wherein the k-space data is acquired from multiple coils of the imaging apparatus.

* * * * *